(12) United States Patent
Yoshikawa

(10) Patent No.: US 10,283,255 B2
(45) Date of Patent: May 7, 2019

(54) REACTOR

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka (JP)

(72) Inventor: Kouhei Yoshikawa, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka (JP)

( * ) Notice: Subject to any disclaimer, the term of this patent is extended or adjusted under 35 U.S.C. 154(b) by 52 days.

(21) Appl. No.: 15/565,773

(22) PCT Filed: Apr. 8, 2016

(86) PCT No.: PCT/JP2016/061592
§ 371 (c)(1),
(2) Date: Oct. 11, 2017

(87) PCT Pub. No.: WO2016/167199
PCT Pub. Date: Oct. 20, 2016

(65) Prior Publication Data
US 2018/0122551 A1    May 3, 2018

(30) Foreign Application Priority Data
Apr. 15, 2015    (JP) .................................. 2015-083602

(51) Int. Cl.
*H01F 27/22* (2006.01)
*H01F 27/26* (2006.01)
(Continued)

(52) U.S. Cl.
CPC ......... *H01F 27/266* (2013.01); *H01F 27/022* (2013.01); *H01F 27/025* (2013.01);
(Continued)

(58) Field of Classification Search
CPC ........................................... H01F 27/00–27/36
(Continued)

(56) References Cited

U.S. PATENT DOCUMENTS

| | | | |
|---|---|---|---|
| 9,786,433 B2* | 10/2017 | Suzuki | H01F 27/263 |
| 2012/0139684 A1* | 6/2012 | Kobayashi | H01F 27/022 |
| | | | 336/92 |
| 2013/0038415 A1* | 2/2013 | Ooishi | H01F 27/22 |
| | | | 336/61 |

FOREIGN PATENT DOCUMENTS

| | | |
|---|---|---|
| JP | S57-158259 A | 9/1982 |
| JP | 2005-072198 A | 3/2005 |

(Continued)

OTHER PUBLICATIONS

Search Report for PCT/JP2016/061592, dated Jun. 21, 2016.

*Primary Examiner* — Tuyen T Nguyen
(74) *Attorney, Agent, or Firm* — Honigman LLP

(57) ABSTRACT

Provided is a reactor configured to suppress damage to a core thereof accompanying vibrations during an operation of the reactor and to reduce noise, while fixing an assembly of a coil and the core to a casing. A reactor includes: a coil, a magnetic core and a coil, a casing and a sealing resin portion. The reactor includes a support portion that is attached to the casing and arranged so as to overlap an upper face of an outer core portion of the magnetic core exposed from the coil, and, together with the sealing resin portion, prevents detachment of the assembly from the casing, the sealing resin portion is interposed between an upper face of the outer core portion and a lower face of the support (Continued)

portion, and the outer core portion and the support portion are not in direct contact with each other.

4 Claims, 4 Drawing Sheets

(51) Int. Cl.
    *H01F 37/00*     (2006.01)
    *H01F 27/02*     (2006.01)
    *H01F 27/32*     (2006.01)
    *H01L 49/02*     (2006.01)
    *H01F 27/30*     (2006.01)
    *H01F 27/255*     (2006.01)

(52) U.S. Cl.
    CPC ......... *H01F 27/306* (2013.01); *H01F 27/324* (2013.01); *H01F 37/00* (2013.01); *H01L 28/10* (2013.01); *H01F 27/255* (2013.01)

(58) Field of Classification Search
    USPC ........ 336/65, 90, 92, 96, 180–184, 220–223
    See application file for complete search history.

(56) References Cited

FOREIGN PATENT DOCUMENTS

| | | |
|---|---|---|
| JP | 2007-180225 A | 7/2007 |
| JP | 2008-147566 A | 6/2008 |
| JP | 2009-194198 A | 8/2009 |
| JP | 2013-055364 A | 3/2013 |

\* cited by examiner

REACTOR

CROSS-REFERENCE TO RELATED APPLICATIONS

This application is the U.S. national stage of PCT/JP2016/061592 filed Apr. 8, 2016, which claims priority of Japanese Patent Application No. JP 2015-083602 filed Apr. 15, 2015.

TECHNICAL FIELD

The present invention relates to a reactor used in electric power converting apparatuses such as vehicle-mounted DC-DC converters for hybrid cars, and particularly relates to a reactor in which it is possible to suppress damage to a magnetic core thereof accompanying vibrations during an operation of the reactor and to reduce noise, while fixing an assembly of a coil and the core to a casing.

BACKGROUND

Reactors are a type of circuit component that increases and decreases voltages. Reactors are used in converters mounted on vehicles such as hybrid cars.

For example, JP 2013-055364A discloses a reactor structure (reactor) in which a reactor (assembly) including a coil and a core (magnetic core) is accommodated in a casing, wherein the reactor is fixed to the casing by using a stay member (support portion) fixed to the casing and a resin (sealing resin portion) with which the casing is filled. The stay member exerts pressure from above on an exposed portion of the core exposed from the coil. The casing is filled with the resin such that the entire reactor is embedded.

If the support portion presses the exposed portion of the core from above, the support portion is in contact with the exposed portion, so that the assembly can be firmly fixed to the casing. However, if the support portion is in direct contact with the core, a stress may be applied to the core when vibrations occur due to magnetostriction or the like of the core during an operation of the reactor, and thus the core may be damaged. Furthermore, since the support portion is fixed to the casing, the support portion functions as a transmission path of vibrations from the core to the casing, and thus noise may increase.

The present invention was made in view of these circumstances, and it is an object thereof to provide a reactor in which it is possible to suppress damage to a core thereof accompanying vibrations during an operation of the reactor and to reduce noise, while fixing an assembly of a coil and the core to a casing.

SUMMARY

An aspect of the present invention is directed to a reactor including: a coil, a magnetic core around which the coil is arranged, a casing in which an assembly of the coil and the magnetic core is accommodated, and a sealing resin portion with which the casing is filled so that at least part of the assembly is sealed, wherein, when the side of the casing on which the assembly is placed is referred to as a lower side, the reactor includes a support portion that is attached to the casing, is arranged so as to overlap an upper face of an outer core portion of the magnetic core that is exposed from the coil, and, together with the sealing resin portion, prevents detachment of the assembly from the casing, the sealing resin portion is interposed between the upper face of the outer core portion and a lower face of the support portion, and the outer core portion and the support portion are not in direct contact with each other.

Advantageous Effects of Invention

According to this reactor, it is possible to suppress damage to a core thereof accompanying vibrations during an operation of the reactor and to reduce noise, while fixing the assembly to a casing.

DETAILED DESCRIPTION OF PREFERRED EMBODIMENTS

Figure 1:
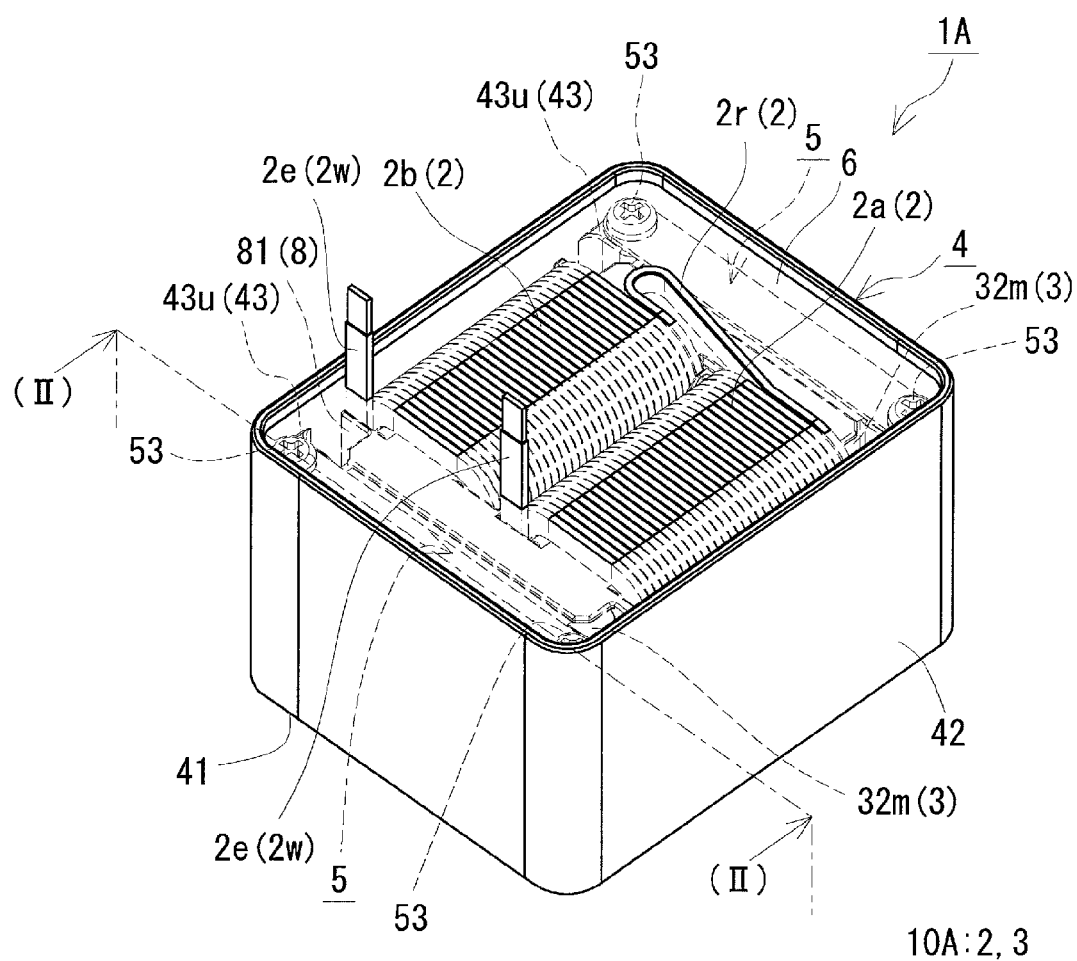
FIG. 1 is a schematic perspective view showing a reactor of Embodiment 1.

First, aspects of the present invention will be listed and described.

(1) An aspect of the present invention is directed to a reactor including: a coil, a magnetic core around which the coil is arranged, a casing in which an assembly of the coil and the magnetic core is accommodated, and a sealing resin portion with which the casing is filled so that at least part of the assembly is sealed, wherein, when the side of the casing on which the assembly is placed is referred to as a lower side, the reactor includes a support portion that is attached to the casing, is arranged so as to overlap an upper face of an outer core portion of the magnetic core that is exposed from the coil, and, together with the sealing resin portion, prevents detachment of the assembly from the casing, the sealing resin portion is interposed between the upper face of the outer core portion and a lower face of the support portion, and the outer core portion and the support portion are not in direct contact with each other.

With this configuration, the assembly can be firmly fixed to the casing. The reason for this is that at least part of the assembly is sealed by the sealing resin portion, and, furthermore, the outer core portion can be fixed to the lower face of the support portion via the sealing resin portion between the support portion and the outer core portion.

Furthermore, with this configuration, damage to the core can be suppressed. Since the sealing resin portion is interposed between the upper face of the outer core portion and the lower face of the support portion, the stress that is applied to the outer core portion accompanying vibrations during an operation of the reactor can be reduced compared with the case in which the support portion is in contact with the upper face of the outer core portion and presses down the upper face.

Furthermore, with this configuration, vibrations of the casing can be suppressed, and thus noise can be suppressed. The reason for this is that, since the sealing resin portion is interposed between the upper face of the outer core portion and the lower face of the support portion, the support portion rarely functions as a transmission path of vibrations from the magnetic core to the casing compared with the case in which the support portion is in contact with the upper face of the outer core portion and presses down the upper face.

(2) According to another aspect of the reactor, the sealing resin portion has a Shore A hardness of at least 20 and at most 90.

If the Shore A hardness is at least 20, the assembly can be easily firmly fixed to the casing, and detachment of the assembly from the casing can be easily suppressed. If the Shore A hardness is not more than 90, transmission of vibrations from the magnetic core to the casing can be easily suppressed.

(3) According to another aspect of the reactor, the support portion is at least partially embedded in the sealing resin portion.

When the support portion is partially embedded, the weight of the reactor can be reduced compared with the case in which the support portion is completely embedded because the amount of sealing resin portion can be reduced. When the support portion is completely embedded, the support portion can be protected from external environments more reliably than in the case where the support portion is partially embedded.

(4) According to another aspect of the reactor, a distance between the upper face of the outer core portion and the lower face of the support portion is at least 0.1 mm and at most 2.0 mm.

If the distance is at least 0.1 mm, filling with the constituent resin of the sealing resin portion can be quickly performed without voids. Moreover, this configuration is effective in suppressing transmission of vibrations from the outer core portion via the support portion to the casing. If the distance is not more than 2.0 mm, the size of reactor can be made smaller. If the distance is too large, the height of the reactor increases, and the amount of resin for filling increases, resulting in an increase in the size and the weight of the reactor.

Hereinafter, an embodiment of the present invention will be described in detail with reference to the drawings.

Embodiment 1

Overall Configuration of Reactor

Hereinafter, a reactor 1A of Embodiment 1 will be described with reference to FIGS. 1 to 4. The reactor 1A includes a coil 2, a magnetic core 3 around which the coil 2 is arranged, a casing 4 in which an assembly 10A of the coil 2 and the magnetic core 3 is accommodated, and a sealing resin portion 6 with which the casing 4 is filled so that at least part of the assembly 10A is sealed. The reactor 1A is characterized mainly by including support portions 5 that, together with the sealing resin portion 6, prevent detachment of the assembly 10A from the casing 4, wherein the sealing resin portion 6 is interposed between outer core portions of the magnetic core 3 exposed from the coil 2 and the support portions 5. Hereinafter, the configuration of main characteristic portions and related portions of the reactor 1A, and main effects thereof will be sequentially described, after which each configuration will be described in detail, and, lastly, a method for producing the reactor 1A will be described. In this example, the side of the casing 4 on which the assembly 10A is placed (installation side) is referred to as "lower side", and the side opposite thereto (opposite side) is referred to as "upper side". In the drawings, the same reference numerals denote the same constituent elements.

Configuration of Main Characteristic Portions and Related Portions Coil

Figure 3:
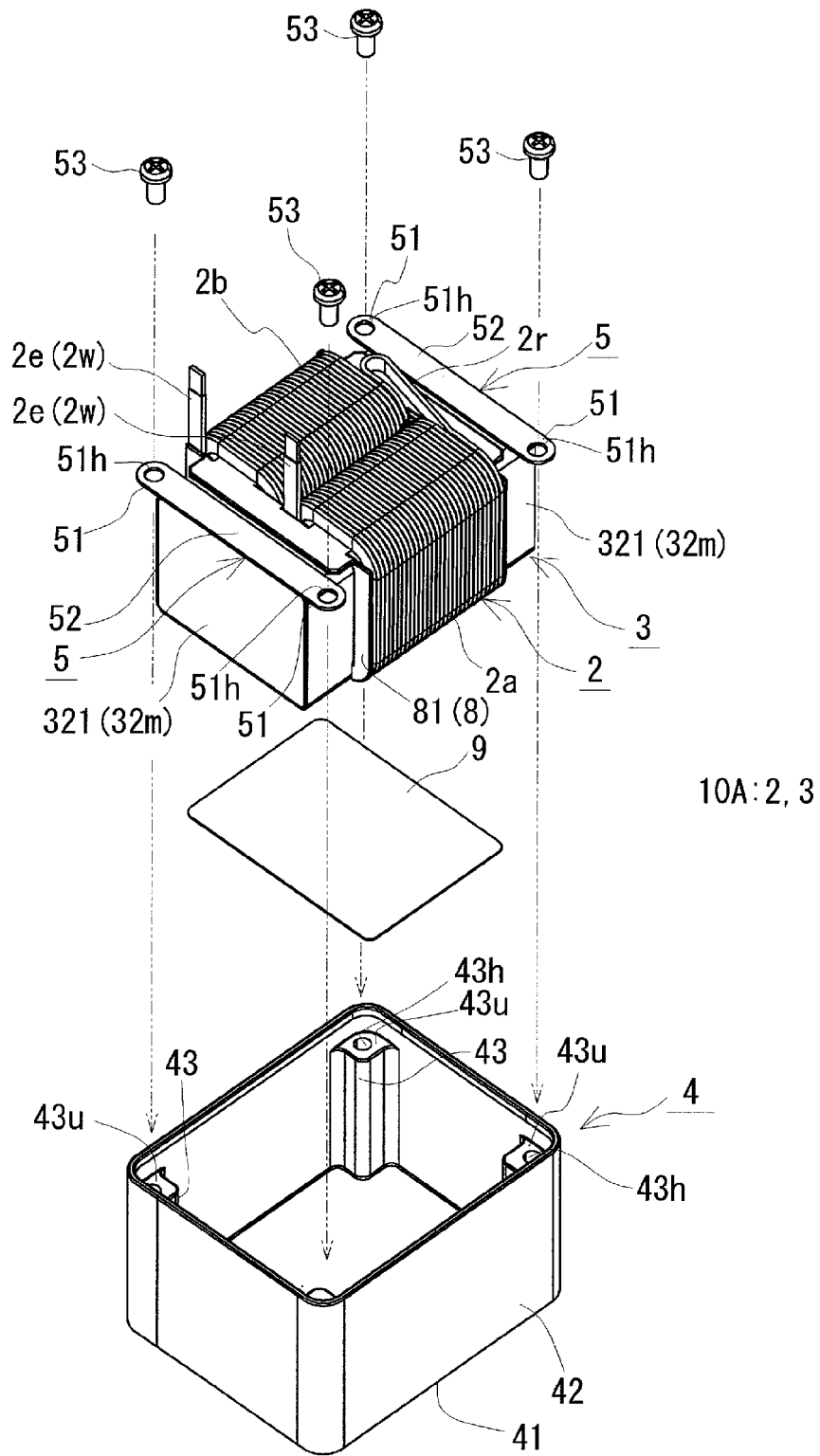
FIG. 3 is an exploded perspective view showing the schematic configuration of the reactor of Embodiment 1.
Figure 4:
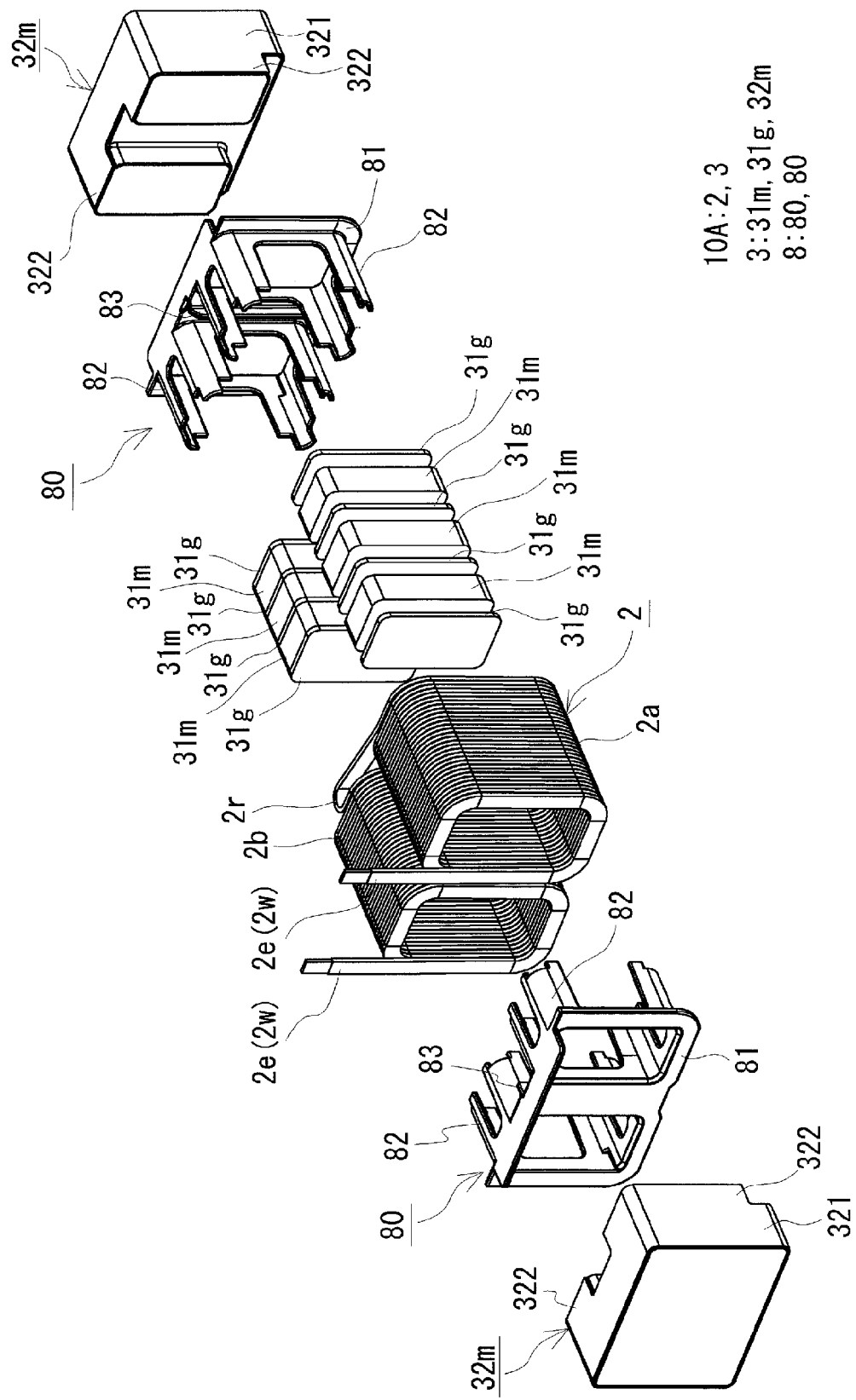
FIG. 4 is an exploded perspective view of an assembly included in the reactor of Embodiment 1.

The coil 2 includes a pair of winding portions 2a and 2b obtained by winding a single, continuous wire 2w without connecting portion into a helical shape, and a connecting portion 2r formed from part of the wire 2w and connecting the two winding portions 2a and 2b (FIGS. 1, 3, and 4). The wire 2w is a coated rectangular wire (so-called enamel wire) including a conductor (copper, etc.) in the form of a rectangular wire, and an insulating coating (polyamideimide, etc.) coating the outer circumference of the conductor. The winding portions 2a and 2b are edgewise coils obtained by winding this coated rectangular wire edgewise. The winding portions 2a and 2b are hollow tubes obtained by winding the wire with the same number of turns, and the end faces of the winding portions 2a and 2b are each in the shape obtained by rounding the corners of a rectangular frame. The winding portions 2a and 2b are arranged side by side (in parallel) such that their axis directions are parallel to each other.

The connecting portion 2r is constituted by bending part of the wire 2w into a U shape on the upper side of one end in the axis direction of the coil 2 (right side in the sections of the diagrams FIGS. 1, 3, and 4). Two end portions 2e of the wire 2w respectively forming the winding portions 2a and 2b extend to points above the coil 2 from the upper side of the turn forming portions, on the side opposite to the connecting portion 2r. The end portions 2e are connected, at a conductor thereof exposed by peeling off the insulating coating at the tip, to terminal members (not shown). The coil 2 is connected via the terminal members to an external apparatus (not shown) such as a power source for supplying electric power to the coil 2.

Magnetic Core

The magnetic core 3 includes outer core portions exposed from the winding portions 2a and 2b and inner core portions arranged inside the winding portions 2a and 2b. The magnetic core 3 is constituted by combining a plurality of core pieces. In this example, as shown in FIG. 4, the magnetic core 3 is constituted by a plurality of rectangular columnar core pieces 31m, a pair of U-shaped core pieces 32m, and a plurality of gap portions 31g interposed between the core pieces. The entire rectangular columnar core pieces 31m are arranged inside the winding portions 2a and 2b. The U-shaped core pieces 32m are partially arranged inside the winding portions 2a and 2b, and are partially exposed outside (exposed from) the winding portions 2a and 2b. The U-shaped core pieces 32m are arranged such that their U-shaped openings face each other, and layers of the rectangular columnar core pieces 31m and the gap portions 31g are arranged side by side (in parallel) between the U-shaped core pieces 32m. With this arrangement, the magnetic core 3 is installed in a ring shape, and forms a closed magnetic circuit when the coil 2 is excited.

In the magnetic core 3, the portions of the U-shaped core pieces 32m arranged outside the winding portions 2a and 2b are referred to as "outer core portions", and the portions of the plurality of rectangular columnar core pieces 31m, the plurality of gap portions 31g, and the U-shaped core pieces 32m arranged inside the winding portions 2a and 2b are referred to as "inner core portions". In this example, the outer core portions are substantially constituted by base portions 321 of the U-shaped core pieces 32m, and the inner core portions are substantially constituted by the rectangular columnar core pieces 31m, the gap portions 31g, and projecting portions 322 of the U-shaped core pieces 32m (all of which will be described later).

Casing

Figure 2:
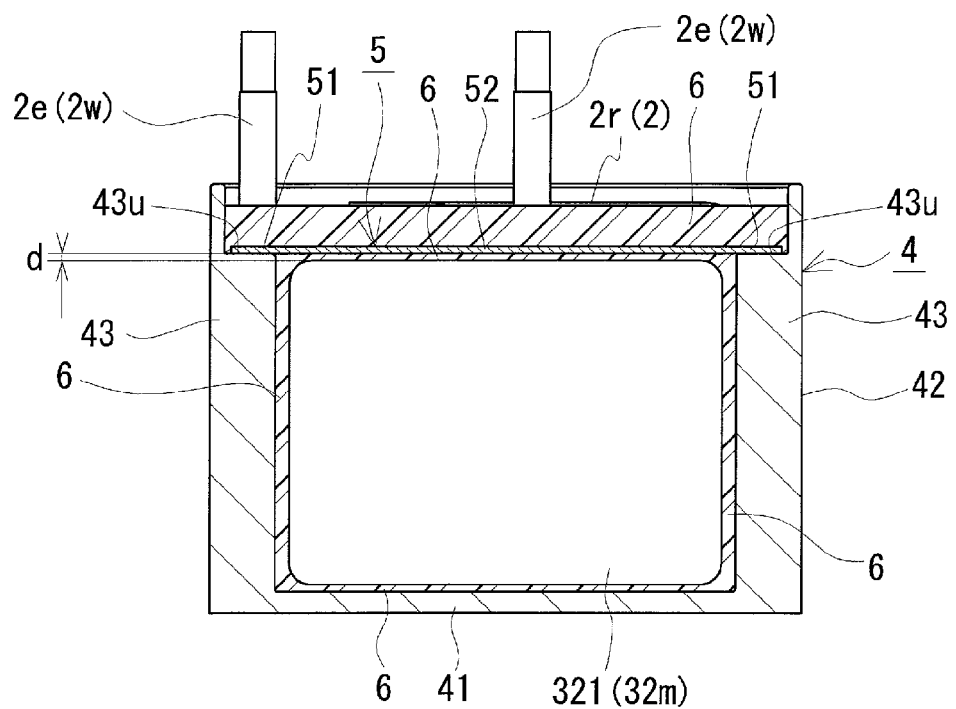
FIG. 2 is a cross-sectional view showing a state in which the reactor shown in FIG. 1 is cut along the cutting line (II)-(II).

The casing 4 accommodates the assembly 10A of the coil 2 and the magnetic core 3 (FIGS. 1, 2, and 3). When the casing 4 accommodates the assembly 10A, the assembly 10A can be protected from external environments (dust, corrosion, etc.) and mechanically protected. The casing 4 includes a bottom plate portion 41 on which the assembly 10A is placed, and a side wall portion 42 surrounding the assembly 10A. The bottom plate portion 41 is in the shape of a flat plate whose lower face is placed on an installation target (not shown) such as a cooling base. The side wall portion 42 is substantially in the shape of a rectangular frame provided upright along the outer periphery of the bottom plate portion 41. The bottom plate portion 41 and the side wall portion 42 are integrally molded.

The height of the side wall portion 42 is set to be greater than that of attachment faces 43u (described later) to which the support portions 5 are to be fixed. Since the sealing resin portion 6 is to be interposed in gaps between the support portions 5 and the upper faces of the outer core portions (the base portions 321), if the height of the side wall portion 42 is greater than that of the attachment faces 43u, then the sealing resin portion 6 can be easily interposed in the gaps without overflowing out of the casing 4. In this example, the height of the side wall portion 42 is set to be greater than that of the attachment faces 43u and slightly greater than that of the upper face of the coil 2.

The four corners of the inner peripheral faces of the side wall portion 42 are provided with attachment members 43 to which the support portions 5 are to be attached. The attachment members 43 are configured so as to respectively occupy the corners of the casing 4. The upper faces of the attachment members 43 are formed as flat faces, and function as the attachment faces 43u to which the support portions 5 are to be attached. The attachment faces 43u are provided with insertion holes 43h into which bolts 53 are to be inserted for fixing the support portions 5.

The position (height) of the attachment faces 43u (the attachment members 43) is set to be greater than that of the upper faces of the outer core portions (the base portions 321). Since the support portions 5 are in the shape of flat plates as described later, when the assembly 10A is accommodated in the casing 4 and the support portions 5 are attached to the attachment members 43, gaps in which the sealing resin portion 6 can be interposed can be formed between the upper faces of the outer core portions and the lower faces of the support portions 5 (FIG. 2). In FIG. 2, the bolts 53 have been omitted. The attachment faces 43u may be positioned so as to be substantially flush with the upper faces of the outer core portions, or so as to be lower than the upper faces. The reason for this is that, as described later in detail, if the shape of the support portions 5 is selected as appropriate, the above-described gaps can be formed between the upper faces of the outer core portions and the lower faces of the support portions 5 regardless of the position of the attachment faces 43u.

Although depending on the shape of the support portions 5, the position (height) of the attachment faces 43u (the attachment members 43) is preferably selected as appropriate such that, when the support portions 5 are attached, a distance d between the lower faces of the support portions 5 and the upper faces of the outer core portions (FIG. 2) is at least 0.1 mm and at most 2.0 mm. If the distance d is set to at least 0.1 mm, filling with the constituent resin of the sealing resin portion 6 can be quickly performed without voids. Moreover, this configuration is effective in suppressing transmission of vibrations from the outer core portions via the support portions 5 to the casing 4. If the distance d is not more than 2.0 mm, the size of the reactor 1A can be made smaller. If the distance is too large, the height of the reactor 1A increases, and the amount of the sealing resin portion 6 for filling increases, resulting in an increase in the size and the weight of the reactor 1A. The distance d may be adjusted as appropriate according to the height of the attachment members 43 and the shape of the support portions 5. The distance d refers to the shortest distance between the lower faces of the support portions 5 and the upper faces of the outer core portions. The distance d is more preferably at least 0.3 mm and at most 1.0 mm.

The inner peripheral faces of the attachment members 43 are along the outer shape of the assembly 10A (the outer peripheral faces of the outer core portions and the end faces of the winding portions 2a and 2b) (FIG. 3).

The inner space defined by the bottom plate portion 41 and the side wall portion 42 is used as a space for accommodating the assembly 10A. The size of the inner space is such that, when the assembly 10A is accommodated therein, gaps that are to be filled with the constituent resin of the sealing resin portion 6 are formed between the casing 4 and the side faces of the assembly 10A (FIG. 2). That is to say, when the gaps are filled with the constituent resin of the sealing resin portion 6 and then the constituent resin is allowed to harden, substantially no voids are formed between the inner peripheral faces of the side wall portion 42 of the casing 4 and the sealing resin portion 6 (FIGS. 1 and 2).

The casing 4 is preferably made of a metal such as aluminum or an alloy thereof, magnesium or an alloy thereof, copper or an alloy thereof, silver or an alloy thereof, iron, austenitic stainless steel, or the like. These metals have a relatively high thermal conductivity, and thus the whole thereof can be used to form heat dissipation paths. That is, heat generated in the assembly 10A can be effectively dissipated to an installation target (e.g., a cooling base), and thus the heat dissipating properties of the reactor 1A can be improved. The assembly 10A can be fixed to the bottom plate portion 41, for example, using a resin layer 9, which will be described later (FIG. 3).

Support Portions

The support portions 5 support the upper faces of the outer core portions (the base portions 321), via the sealing resin portion 6 that has been solidified between the support portions 5 and the upper faces of the outer core portions (the base portions 321). Accordingly, the support portions 5, together with the sealing resin portion 6, prevent detachment of the assembly 10A from the casing 4.

The support portions 5 each include fixing portions 51 that are to be attached to the casing 4 (the attachment members 43), and an overlapping portion 52 having an overlapping region that overlaps the upper face of the outer core portion (the base portion 321). The fixing portions 51 are provided on both end sides in the longitudinal direction, and the overlapping portion 52 is provided substantially at the center in the longitudinal direction. The fixing portions 51 are provided with insertion holes 51h into which fastening members such as the bolts 53 for fixing the support portion 5 to the attachment members 43 are to be inserted (FIG. 3). The overlapping portion 52 of the support portion 5 on the side of the connecting portion 2r of the coil 2 overlaps the upper face of the outer core portion so as not to collide with the connecting portion 2r.

The support portions 5 are each in the shape of a flat plate without curve, in which the fixing portions 51 and the overlapping portions 52 are substantially parallel to the attachment faces 43u. If the support portions 5 are each in the shape of a flat plate, when the assembly 10A is accommodated in the casing 4 and the fixing portions 51 of the support portions 5 are attached to the attachment members 43, gaps with a predetermined distance d in which the sealing resin portion 6 is to be interposed can be formed between the upper faces of the outer core portions (the base portions 321) and the overlapping portions 52 of the support portions 5. The reason for this is that, as described above, the position (height) of the attachment faces 43*u* (the attachment members 43) is set to be greater than that of the upper faces of the outer core portions. In this example, the upper faces of the support portions 5 are positioned so as to be lower than the upper faces of the winding portions 2*a* and 2*b*.

For example, if the position of the attachment faces 43*u* is sufficiently higher than that of the upper faces of the outer core portions (the base portions 321), the support portions 5 are each in the shape of a recessed flat plate that is bent stepwise such that the overlapping portion 52 is lower than the fixing portions 51. Furthermore, if the position of the attachment faces 43*u* is substantially flush with the upper faces of the outer core portions or lower than the upper faces, the support portions 5 may be each in the shape of a projecting flat plate that is bent stepwise such that the overlapping portion 52 is higher than the fixing portions 51, for example.

The support portions 5 may be made of the same metal as that of the casing 4. The reason for this is that the support portions 5 and the outer core portions can be insulated from each other using the sealing resin portion 6 interposed between these portions. Thus, it is not necessary to provide an insulating resin coating around the overlapping portions 52 of the support portions 5. If the support portions 5 are made of a metal, the fixing portions 51 of the support portions 5 can be firmly fixed to the casing 4 made of a metal, and thus detachment of the assembly 10A from the casing 4 can be easily suppressed.

Sealing Resin

The casing 4 is filled with the sealing resin portion 6, so that the assembly 10A accommodated in the casing 4 is sealed (FIGS. 1 and 2). Together with the support portions 5, the sealing resin portion 6 can prevent detachment of the assembly 10A from the casing 4. Furthermore, the assembly 10A can be easily electrically/mechanically protected and protected from external environments, and vibrations of the magnetic core 3 generated when electricity is applied to the coil 2 and noise caused by these vibrations can be easily reduced, for example.

The sealing resin portion 6 is interposed between the upper faces of the outer core portions (the base portions 321) and the lower faces of the support portions 5 (FIG. 2). Since the sealing resin portion 6 is interposed between the outer core portions and the support portions 5, the support portions 5 and the outer core portions are not in direct contact with each other. Thus, the stress that is applied to the outer core portions accompanying vibrations of the magnetic core 3 can be easily reduced, and transmission of vibrations from the magnetic core 3 via the support portions 5 to the casing 4 can be easily suppressed. In this example, the sealing resin portion 6 is interposed across the entire region between the upper faces of the outer core portions and the lower faces of the support portions 5.

The sealing resin portion 6 may be formed throughout the region from the upper face of the bottom plate portion 41 to at least the lower faces of the support portions 5. Accordingly, the sealing resin portion 6 can be interposed between the upper faces of the outer core portions (the base portions 321) and the lower faces of the support portions 5. That is to say, the upper face of the sealing resin portion 6 is positioned at a height that at least allows contact with the lower faces of the support portions 5. In order to interpose the sealing resin portion 6 between the upper faces of the outer core portions and the lower faces of the support portions 5, when filling the casing 4 with the constituent material of the sealing resin portion 6 in producing the sealing resin portion 6, the casing 4 is filled such that the upper face of the sealing resin portion 6 reaches a height that at least allows contact with the lower faces of the support portions 5.

The sealing resin portion 6 may be formed throughout the region up to a height where the support portions 5 are partially embedded (and partially exposed), or throughout the region up to a height where the support portions 5 are completely embedded. That is to say, the upper face of the sealing resin portion 6 may be positioned between the lower faces and the upper faces of the support portions 5, or may be positioned above the upper faces of the support portions 5. If the sealing resin portion 6 is formed up to a height where the support portions 5 are partially embedded, the weight can be smaller than that in the case where the sealing resin portion 6 is formed up to a height where the support portions 5 are completely embedded, because the amount of the sealing resin portion 6 can be reduced. If the sealing resin portion 6 is formed up to a height where the support portions 5 are completely embedded, the support portions 5 can be protected from external environments more reliably than in the case where the sealing resin portion 6 is formed up to a height where the support portions 5 are partially embedded. The upper face of the sealing resin portion 6 is the surface of the sealing resin portion 6 that has hardened, and corresponds to a face that was the liquid surface of the constituent resin of the sealing resin portion 6 that had not hardened when the casing 4 was filled with that constituent resin.

In this example, the sealing resin portion 6 is formed throughout the region from the upper face of the bottom plate portion 41 up to a height where the support portions 5 are completely embedded, except for the two end portions 2*e* of the wire 2*w*, the upper faces of the winding portions 2*a* and 2*b*, and the upper face of the connecting portion 2*r* (FIGS. 1 and 2). As described later in detail, the sealing resin portion 6 is interposed also between the lower faces of the outer core portions (the base portions 321) and the bottom plate portion 41 (FIG. 2). The reason for this is that, as described later, the lower faces of the base portions 321 are positioned so as to be higher than the lower face of the coil 2.

Examples of the constituent resin of the sealing resin portion 6 include insulating resins such as epoxy resins, urethane resins, silicone resins, unsaturated polyester resins, and the like. Of these resins, soft resins are particularly preferable. If the sealing resin portion 6 is made of a soft resin, transmission of vibrations from the magnetic core 3 to the casing 4 can be easily suppressed. Specifically, the sealing resin portion 6 preferably has a Shore A hardness of at least 20 and at most 90. The Shore A hardness is a value as defined in "Testing Methods for Durometer Hardness of Plastics JIS K 7215 (1986)". If the Shore A hardness is at least 20, the assembly 10A can be firmly fixed to the casing 4, and thus detachment of the assembly 10A from the casing 4 can be easily suppressed. If the Shore A hardness is not more than 90, transmission of vibrations from the magnetic core 3 to the casing 4 can be easily suppressed. The Shore A hardness is particularly preferably at least 30 and at most 70. If the constituent resin of the sealing resin portion 6 further contains fillers that are excellent in terms of insulating properties and heat dissipating properties, the insulating properties and the heat dissipating properties (heat conducting properties) of the sealing resin portion 6 can be improved. Note that the region made of such a soft resin may be only a region between the upper faces of the outer core portions and the support portions 5, and other regions may be made of a resin that is harder than this region.

Actions and Effects of Main Characteristic Portions of Reactor

According to the reactor 1A, the support portions 5 and the sealing resin portion 6 can prevent detachment of the assembly 10A from the casing 4, and, since the sealing resin portion 6 is interposed between the upper faces of the outer core portions and the lower faces of the support portions 5, damage to the outer cores, vibrations of the casing 4, and noise can be suppressed.

Description of Configuration Including Other Characteristic Portions

Magnetic Core

As described above, the magnetic core 3 is constituted by the plurality of rectangular columnar core pieces 31m, the pair of U-shaped core pieces 32m, and the plurality of gap portions 31g interposed between the core pieces (FIG. 4). The rectangular columnar core pieces 31m preferably have a shape that conforms to the inner peripheral shape of the winding portions 2a and 2b. In this example, the rectangular columnar core pieces 31m each have a shape of a rectangular parallelepiped whose corners are rounded along the corners of the inner peripheral faces of the winding portions 2a and 2b. The number of the rectangular columnar core pieces 31m may be selected as appropriate.

The pair of U-shaped core pieces 32m have the same shape. The U-shaped core pieces 32m each include the base portion 321 in the shape of a rectangular parallelepiped arranged outside the winding portions 2a and 2b so as to cross over the winding portions 2a and 2b, and the pair of projecting portions 322 projecting from the base portion 321 so as to respectively arranged inside the winding portions 2a and 2b. The base portion 321 and the pair of projecting portions 322 are an integral part that has been integrally molded.

The end faces of the pair of projecting portions 322 have substantially the same shape and size as the end faces of the rectangular columnar core pieces 31m, and their size and projecting length may be selected as appropriate to provide a predetermined magnetic path cross-sectional area according to the coil 2. The pair of projecting portions 322 preferably have a shape that conforms to the shape of the winding portions 2a and 2b, and, in this example, the projecting portions 322 have corners that are rounded substantially along the corners of the inner peripheral faces of the winding portions 2a and 2b.

The upper face of the base portion 321 is substantially flush with the upper faces of the projecting portions 322 and the rectangular columnar core pieces 31m. The lower face of the base portion 321 projects so as to be lower than the lower faces of the rectangular columnar core pieces 31m, but is positioned so as to be higher than the lower face of the coil 2. That is to say, the installation face of the assembly 10A is constituted substantially by the lower face of the coil 2, and the sealing resin portion 6 is interposed between the lower face of the base portion 321 and the bottom plate portion 41 (FIG. 2). Since the coil 2 is in contact with the bottom plate portion 41 in this manner, the heat dissipating properties are ensured, and, at the same time, since the sealing resin portion 6 is interposed between the lower face of the base portion 321 and the bottom plate portion 41, transmission of vibrations via the base portion 321 to the casing 4 can be suppressed, and thus noise can be reduced.

The core pieces 31m and 32m may be made of a material containing at least 30 volume %, or more than 50 volume % of soft magnetic material. Specifically, examples of such a material include powder compacts obtained by compression-molding powders of soft magnetic metals such as iron and iron alloys (Fe—Si alloys, Fe—Ni alloys, etc.), coated powders further including an insulating coating, or the like, and composite materials (molded hardened bodies) containing a soft magnetic powder and a resin wherein the resin has been solidified (hardened). In this example, the core pieces 31m and 32m are made of a powder compact.

The gap portions 31g each have a shape that conforms to a gap formed between adjacent core pieces (31m and 31m, 31m and 32m), and, for example, in the shape of a rectangular flat plate in plan view (when viewed from the coil axis direction). The shape and number of the gap portions 31g may be selected as appropriate. The gap portions 31g may be made of a material with a relative permeability that is lower than that of the rectangular columnar core pieces 31m and the U-shaped core pieces 32m, and examples of such a material include non-magnetic materials such as alumina. Furthermore, the gap portions 31g may be formed in one piece with the sealing resin portion 6, using the constituent resin of the sealing resin portion 6.

Interposed Member

The reactor 1A may include an interposed member 8 interposed between the coil 2 and the magnetic core 3 (FIGS. 1, 3, and 4). The interposed member 8 improves the electrical insulating properties between the coil 2 and the magnetic core 3.

The interposed member 8 is formed by, for example, combining a pair of divided pieces 80 that have been divided in the axis direction of the winding portions 2a and 2b of the coil 2. Each divided piece 80 may include an end face interposed portion 81 interposed between the end faces of the winding portions 2a and 2b and the inner end face of the U-shaped core piece 32m (the base portion 321), and inner interposed portions 82 interposed between at least part of the winding portions 2a and 2b and the inner core portions including the plurality of rectangular columnar core pieces 31m (FIG. 4). The end face interposed portion 81 and the inner interposed portions 82 are formed in one piece.

End Face Interposed Portion

The end face interposed portion 81 insulates the end faces of the winding portions 2a and 2b (the coil 2) from the outer core portion (the base portion 321). The end face interposed portion 81 is constituted by a flat plate member in the shape of a B having a pair of openings (through holes) into which the inner core portions can be respectively inserted. The coil-side face of the end face interposed portion 81 is in contact with the winding portions 2a and 2b at the end faces thereof (side end faces and lower end faces) except for the upper end faces (FIG. 3). That is to say, the end face interposed portion 81 is not in contact with the upper end face of the coil 2, the upper end face of the coil 2 is exposed from the end face interposed portion 81.

Inner Interposed Portions

The inner interposed portions 82 insulate the inner peripheral faces of the winding portions 2a and 2b (the coil 2) and the inner core portions. The inner interposed portions 82 are constituted by a plurality of curved plate pieces arranged along the rounded corners of the winding portions 2a and 2b. Since the inner interposed portions 82 are in the form of plate pieces, the filling with a resin material that has not been solidified, which is the constituent material of the sealing resin portion 6, can be easily performed during the production. The end portions of the inner interposed portions 82 are formed so as to be engageable with each other.

Partitioning Portion

Each divided piece 80 includes a partitioning portion 83 that ensures insulation between the winding portions 2a and 2b. The partitioning portion 83 is provided between the inner interposed portions 82, on the end face interposed portion 81, so as to be interposed between the winding portions 2a and 2b. The partitioning portion 83 is formed in one piece with the end face interposed portion 81.

Material

Examples of the constituent resin of the interposed member 8 include thermoplastic resins such as polyphenylenesulfide (PPS) resins, polytetrafluoroethylene (PTFE) resins, liquid crystal polymers (LCP), polyamide (PA) resins, and polybutylene terephthalate (PBT) resins. In this example, a PPS resin is used.

Resin Layer

The resin layer 9 may be provided so as to be in contact with at least one of the lower face of the coil 2 and the lower face of the magnetic core 3 (FIG. 3). If the resin layer 9 is provided, the assembly 10A can be firmly fixed to the bottom plate portion 41 of the casing 4, and movement of the coil 2 can be restricted, the heat dissipating properties can be improved, and the fixing to the bottom plate portion 41 can be stabilized, for example. In this example, the size of the resin layer 9 is such that the resin layer 9 is located on the entire lower face of the coil 2. The constituent material of the resin layer 9 is preferably an insulating resin, and particularly an insulating resin containing ceramic fillers or the like and having excellent heat dissipating properties (e.g., a thermal conductivity of preferably at least 0.1 W/m·K, more preferably at least 1 W/m·K, and particularly preferably at least 2 W/m·K). Specific examples of the resin include thermosetting resins such as epoxy resins, silicone resins, and unsaturated polyesters, and thermoplastic resins such as PPS resins and LCP.

Reactor Production Method

The reactor 1A can be produced, for example, using a reactor production method including a preparing step, an arranging step, and a filling step as follows. In the preparing step, the assembly 10A obtained by combining the coil 2 and the magnetic core 3, the casing 4, the support portions 5 and the bolts 53, the constituent resin of the sealing resin portion 6, and the resin layer 9 are prepared. In the arranging step, the resin layer 9 is formed on the upper face of the bottom plate portion 41 of the casing 4, and the assembly 10A is placed on the resin layer 9. Subsequently, the support portions 5 are placed on the attachment faces 43u of the attachment members 43 of the casing 4, and are fixed using the bolts 53, so that the support portions 5 overlap the base portions 321. In the filling step, the casing 4 is filled with the constituent resin of the sealing resin portion 6 up to a predetermined height, and the constituent resin is allowed to harden (is solidified). Accordingly, it is possible to produce the reactor 1A in which the sealing resin portion 6 is interposed between the upper faces of the base portions 321 and the lower faces of the support portions 5 so that the base portions 321 and the support portions 5 are not in contact with each other.

With this production method, if the height of the attachment members 43 of the casing 4 and the shape of the support portions 5 are selected as appropriate and a gap with a predetermined distance d is formed between the upper faces of the outer core portions and the lower faces of the support portions 5, the reactor 1A in which the sealing resin portion 6 is interposed between the upper faces of the outer core portions and the support portions 5 can be produced by filling the casing 4 with the constituent resin of the sealing resin portion 6.

It is intended that the scope of the invention be defined not by the foregoing examples, but by the claims, including all changes that come within the meaning and range of equivalents thereof. For example, a combination of a plurality of core pieces of the magnetic core may be those referred to as a U-U core, an L-L (J-J) core, or the like. Also, the reactor may include a coil having only one winding portion, and a magnetic core referred to as an E-E core or an E-I core.

INDUSTRIAL APPLICABILITY

The reactor of the present invention can be preferably used as constituent components of various converters and electric power converting apparatuses, such as vehicle-mounted converters (typically, DC-DC converters) mounted on vehicles such as hybrid cars, plug-in hybrid cars, electric vehicles, fuel cell vehicles, and the like, and converters for air conditioners.

The invention claimed is:

1. A reactor comprising: a coil, a magnetic core around which the coil is arranged, a casing in which an assembly of the coil and the magnetic core is accommodated, and a sealing resin portion with which the casing is filled so that at least part of the assembly is sealed,
    wherein, when the side of the casing on which the assembly is placed is referred to as a lower side,
        the reactor comprises a support portion that is attached to the casing, is arranged so as to overlap an upper side of an outer core portion of the magnetic core that is exposed from the coil, and, together with the sealing resin portion, prevents detachment of the assembly from the casing,
        the sealing resin portion is interposed across the entire region between an upper face of the outer core portion and a lower face of the support portion,
        the outer core portion and the support portion are not in direct contact with each other, and a distance between the upper face of the outer core portion and the lower face of the support portion is at least 0.1 mm and at most 2.0 mm, and
    the support portion is completely embedded in the sealing resin portion.

2. The reactor according to claim 1, wherein the sealing resin portion has a Shore A hardness of at least 20 and at most 90.

3. The reactor according to claim 1, wherein the support portion is at least partially embedded in the sealing resin portion.

4. The reactor according to claim 2, wherein the support portion is at least partially embedded in the sealing resin portion.

* * * * *